(12) United States Patent
Chan et al.

(10) Patent No.: US 9,484,241 B2
(45) Date of Patent: Nov. 1, 2016

(54) DEVICE FOR HOLDING MULTIPLE SEMICONDUCTOR DEVICES DURING THERMOCOMPRESSION BONDING AND METHOD OF BONDING

(71) Applicants: Man Chung Chan, Kwai Chung (HK); Chun Ho Fan, Kwai Chung (HK)

(72) Inventors: Man Chung Chan, Kwai Chung (HK); Chun Ho Fan, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 382 days.

(21) Appl. No.: 13/953,152

(22) Filed: Jul. 29, 2013

(65) Prior Publication Data

US 2015/0027616 A1    Jan. 29, 2015

(51) Int. Cl.
*H01L 21/00* (2006.01)
*H01L 21/683* (2006.01)
*H01L 23/00* (2006.01)

(52) U.S. Cl.
CPC .......... *H01L 21/6838* (2013.01); *H01L 24/75* (2013.01); *H01L 24/81* (2013.01); *H01L 24/83* (2013.01); *H01L 24/97* (2013.01); *H01L 24/27* (2013.01); *H01L 2224/16225* (2013.01); *H01L 2224/16227* (2013.01); *H01L 2224/16245* (2013.01); *H01L 2224/2732* (2013.01);
(Continued)

(58) Field of Classification Search
CPC ............... H01L 21/6838; H01L 2224/75745; H01L 2224/81203; H01L 2224/82203; H01L 2224/3203; H01L 2224/84203; H01L 2224/85203; Y10T 156/1092; Y10T 156/1702
USPC ................................ 156/499, 539, 556, 558
See application file for complete search history.

(56) References Cited

U.S. PATENT DOCUMENTS

| | | | | |
|---|---|---|---|---|
| 2007/0000592 A1* | 1/2007 | Fares | ...................... | H01L 24/81 156/64 |
| 2008/0110546 A1* | 5/2008 | Omizo | .............. | H01L 21/67132 156/64 |
| 2010/0316478 A1* | 12/2010 | Na | ...................... | H01L 21/6838 414/752.1 |

FOREIGN PATENT DOCUMENTS

WO    WO 2012165313 A1 * 12/2012 ............. H01L 24/83

OTHER PUBLICATIONS

Translation of WO 2012165313 A1, published Dec. 2012, Terada Katsumi, Japan.*

*Primary Examiner* — George Koch
(74) *Attorney, Agent, or Firm* — Ostrolenk Faber LLP

(57) ABSTRACT

Disclosed is a device for holding a plurality of semiconductor devices during thermocompression bonding, comprising: a body; a plurality of support surfaces at a first side of the body, each support surface being configured for holding at least one semiconductor device during thermocompression bonding; and a plurality of internal conduits within the body, each internal conduit extending from an opening of a respective one of the support surfaces at the first side of the body to an opening at a second side of the body. In particular, the openings at the second side of the body are configured to be connected to separate pneumatic paths to be in fluid communication therewith, each pneumatic path having an independently controlled pneumatic suction force so that the openings of the support surfaces at the first side of the body are operative to selectively hold the one or more semiconductor devices against the support surfaces at the first side of the body or to release the same therefrom. An apparatus for holding semiconductor devices during thermocompression bonding, and a method of bonding a plurality of semiconductor devices to a substrate via thermocompression bonding are also disclosed.

12 Claims, 4 Drawing Sheets

(52) U.S. Cl.
CPC ............... *H01L 2224/32225* (2013.01); *H01L 2224/32245* (2013.01); *H01L 2224/73204* (2013.01); *H01L 2224/7531* (2013.01); *H01L 2224/7598* (2013.01); *H01L 2224/75745* (2013.01); *H01L 2224/81024* (2013.01); *H01L 2224/81191* (2013.01); *H01L 2224/81203* (2013.01); *H01L 2224/81907* (2013.01); *H01L 2224/83192* (2013.01); *H01L 2224/83203* (2013.01); *H01L 2224/83907* (2013.01); *H01L 2224/97* (2013.01); *Y10T 156/1092* (2015.01); *Y10T 156/1702* (2015.01)

DEVICE FOR HOLDING MULTIPLE SEMICONDUCTOR DEVICES DURING THERMOCOMPRESSION BONDING AND METHOD OF BONDING

FIELD OF THIS INVENTION

This invention relates to a device for holding multiple semiconductor devices particularly, but not exclusively, to transfer the semiconductor devices from a supply of semiconductor devices to a substrate, and bonding the semiconductor devices to the substrate via thermocompression bonding.

BACKGROUND OF THE INVENTION

In a typical flip chip thermocompression bonding process, a flip chip is held on a bond collet of the bond head of a flip chip bonder by a vacuum suction force. Accordingly, flip chips can be individually transferred from a supply of flip chips to a substrate for thermocompression bonding. After a flip chip is held on the bond collet, an imaging system is used to determine the flip chip position in relation to a desired substrate location for bonding thereto. Specifically, the imaging system includes an uplook pattern recognition system to determine the flip chip position. The uplook pattern recognition system may either be a fixed or moving uplook camera. The imaging system also includes a downlook pattern recognition system to identify the desired substrate location to which the flip chip is to be bonded. The downlook pattern recognition system is typically a moving downlook camera for locating a desired bond pad position of the substrate. Based on the data captured by the imaging system, the bond head of the flip chip bonder will accordingly move horizontally along the X axis and/or the Y axis, and/or rotate about a vertical Z axis by an angle of theta, in order to reposition the bond collet so that the flip chip will be accurately placed on the substrate. Thereafter, the bond collet will be moved vertically downwards along the vertical Z axis at a Z-axis speed towards the desired bond pad position of the substrate until the flip chip contacts with the desired bond pad position and thermocompression bonding is then carried out. The process cycle repeats for a next flip chip that is picked up by the bond collet, with each process cycle typically requiring about 3.5 seconds. Accordingly, the throughput capacity of the conventional flip chip bonder in terms of units-per-hour (UPH) is about 500. The flip chip thermocompression bonding process also involves adhering to various profiles such as a bond force profile between the flip chip and the substrate, a temperature profile of the bond collet, and a position profile of the bond collet.

Due to the transfer of flip chips individually to the substrate, the throughput capacity of the flip chip bonder for performing thermocompression bonding is limited. This is exacerbated by various operating considerations, such as the need for precise alignment between the flip chips and the corresponding bond pad positions of the substrate to which the flip chips are bonded, a slow Z-axis speed required to avoid formation of air voids in the adhesives dispensed on the substrate bond pads upon contact with the flip chips, a low temperature required for the contact between the adhesives and the flip chips which increases curing time, a long heating time to heat up the flip chips which increases the duration of each cycle of the thermocompression bonding process, and a long cooling time to cool the bond collet before a next flip chip is picked up.

Thus, it is an object of this invention to ameliorate the limitation of conventional flip chip bonders for thermocompression bonding, and to provide the general public with one or more useful choices.

SUMMARY OF THE INVENTION

A first aspect of the invention is a device for holding a plurality of semiconductor devices during thermocompression bonding. The device comprises: a body; a plurality of support surfaces at a first side of the body, each support surface being configured to hold at least one individual semiconductor device during thermocompression bonding; and a plurality of internal conduits within the body, each internal conduit extending from an opening of a respective one of the support surfaces at the first side of the body to an opening at a second side of the body. In particular, the openings at the second side of the body are configured to be connected to separate pneumatic paths in fluid communication therewith each pneumatic path having an independently controlled pneumatic suction force, so that the openings of the support surfaces at the first side of the body are operative to selectively hold the semiconductor devices against the support surfaces at the first side of the body or to release the same therefrom.

A second aspect of the invention is an apparatus for thermocompression bonding of semiconductor devices. The apparatus comprises: a heater and the above device coupled to the heater, wherein the heater is operative to heat the device to thereby heat the semiconductor devices that are being held.

A third aspect of the invention is a method of bonding a plurality of semiconductor devices to a substrate via thermocompression bonding, comprising the steps of: transferring a plurality of semiconductor devices from a supply of semiconductor devices to the substrate using the above device; and bonding the semiconductor devices to the substrate via thermocompression bonding.

Some preferred but optional features/steps of the invention have been defined in the dependent claims.

BRIEF DESCRIPTION OF THE DRAWINGS

Preferred embodiments of the invention will now be described, with reference to the accompanying drawings, of which:

FIG. 2a shows the heater and the collet of the bond head of FIG. 1 exclusively when they are taken apart, while FIG. 2b is a cross-sectional view of the collet when viewed along line A-A' in the direction shown in FIG. 2a;

DETAILED DESCRIPTION OF THE PREFERRED EMBODIMENTS

Figure 1:
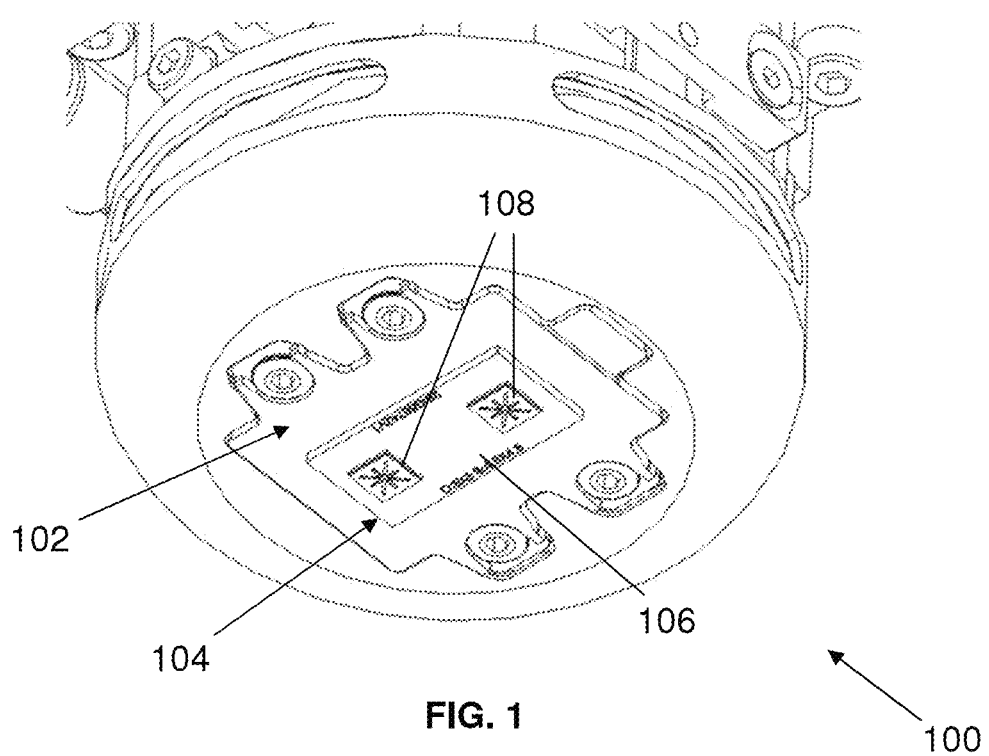
FIG. 1 shows a bond head of a flip chip bonder, comprising a heater and a collet according to a first preferred embodiment of the invention.

FIG. 1 shows a bond head 100 of a semiconductor device bonder (in particular, a flip chip bonder) for thermocompression bonding between the semiconductor devices (in particular, flip chips) and a substrate (eg. a lead frame or a Bismaleimide Triazine (BT) substrate). The bond head 100 comprises a heater 102 and a device (in particularly, a collet 104 according to a first embodiment of the invention) coupled to the heater 102 via a pneumatic vacuum suction force. The collet 104 is configured to hold a plurality of semiconductor devices during thermocompression bonding, and comprises: i) a body 106; ii) a plurality of support surfaces 108 at a first side 106a of the body 106, each support surface 108 being configured to hold at least one individual semiconductor device during thermocompression bonding; and iii) a plurality of internal conduits 110 (see FIG. 2b) within the body 106, each internal conduit 110 extending from an opening 110a of a respective one of the support surfaces 108 at the first side 106a of the body 106 to an opening 110b at a second side 106b of the body 106. Specifically, the openings 110b at the second side 106b of the body 106 are operative to be in fluid communication with separate pneumatic vacuum paths 112, wherein each vacuum path 112 has an independently controlled pneumatic vacuum suction force. Consequently, the openings 110a of the support surfaces 108 at the first side 106a of the body 106 are operative to selectively hold the one or more semiconductor devices against the support surfaces 108 at the first side 106a of the body 106 or to release the same therefrom.

Figure 2A:
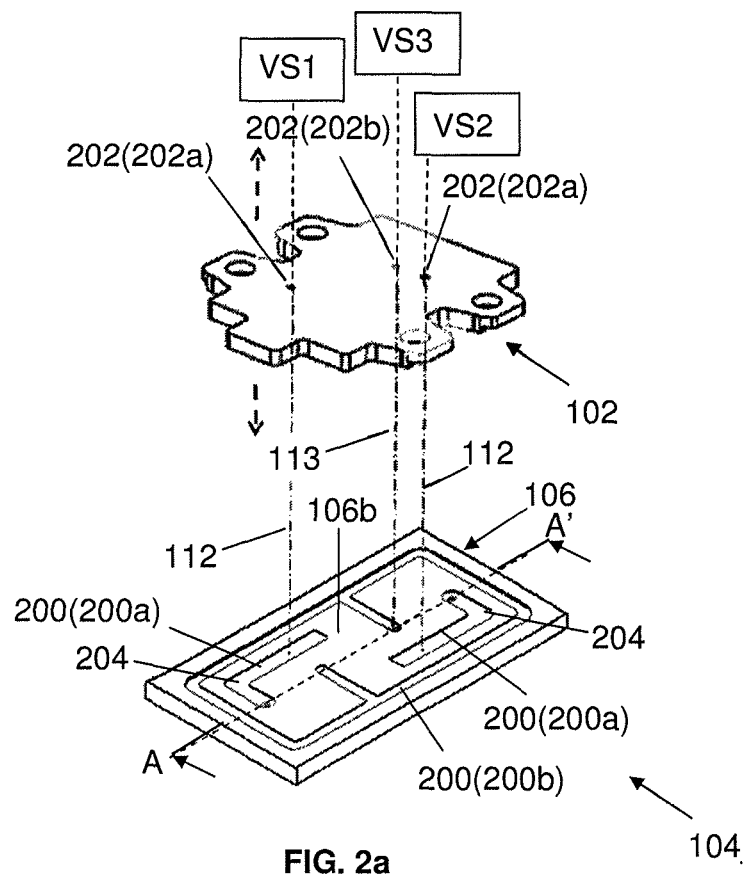

FIG. 2a shows the heater 102 and the collet 104 of the bond head 100 exclusively when they are taken apart, and illustrates respective top views of the heater 102 and the collet 104. The top view of the collet 104 reveals the second side 106b of the body 106 comprising a plurality of pneumatic vacuum passages 200, including multiple semiconductor device passages 200a and a collet passage 200b. The semiconductor device passages 200a are operative to be in fluid communication with the separate vacuum paths 112 as mentioned above, whereas the collet passage 200b is operative to be in fluid communication with a further pneumatic vacuum path 113 with a pneumatic vacuum suction force that is also independently controlled.

As for the top view of the heater 102 shown in FIG. 2a, it can be seen that the heater 102 comprises a plurality of through holes 202, which include first through holes 202a and a second through hole 202b. The first through holes 202a are operative to be in fluid communication with the separate vacuum paths 112, whereas the second through hole 202b is operative to be in fluid communication with the further vacuum path 113. In particular, the vacuum paths 112 are connected to separate pneumatic vacuum sources VS1, VS2, whereas the vacuum path 113 is connected to another pneumatic vacuum source VS3. This allows the semiconductor devices to be selectively held by the collet 104, and the collet 104 to be held against the heater 102, via the respective vacuum suction forces.

Since the heater 102 and the collet 104 both comprise a planar structure, when the collet 104 is held against the heater 102, the base surface of the heater 102 contacts with the top surface (ie. the second side 106b) of the collet 104 to form respective enclosed vacuum paths between the heater 102 and the collet 104. Hence, the vacuum suction forces generated along the first through holes 202a of the heater 102, the semiconductor device passages 200a and internal conduits 110 of the collet 104 are capable of holding the semiconductor devices against the respective support surfaces 108 of the collet 104, whereas the vacuum suction force generated along the second through hole 202b of the heater 102 and the collet passage 200b is capable of holding the collet 104 against the heater 102.

As the vacuum suction forces along the vacuum paths 112, 113 are independently controlled, the collet 104 can either hold two semiconductor devices simultaneously, a single semiconductor device at either of the support surfaces 108, or none at all. Moreover, the collet 104 can be made to couple with the heater 102 when the suction vacuum force along the vacuum path 113 is switched on, and can be made to detach and separate from the heater 102 when the said vacuum suction force is switched off.

More specifically, each of the openings 110b at the second side 106b of the body 106 of the collet 106 is arranged at an end of a respective one of the semiconductor device passages 200a. In addition, each of the semiconductor device passages 200a includes a kink 204 with an angle of 90 degrees. The collet passage 200b, on the other hand, is arranged around a periphery of the second side 106b of the body 106, so that the vacuum suction force can be accordingly distributed around the said periphery to hold the collet 104 against the heater 102.

Figure 2B:
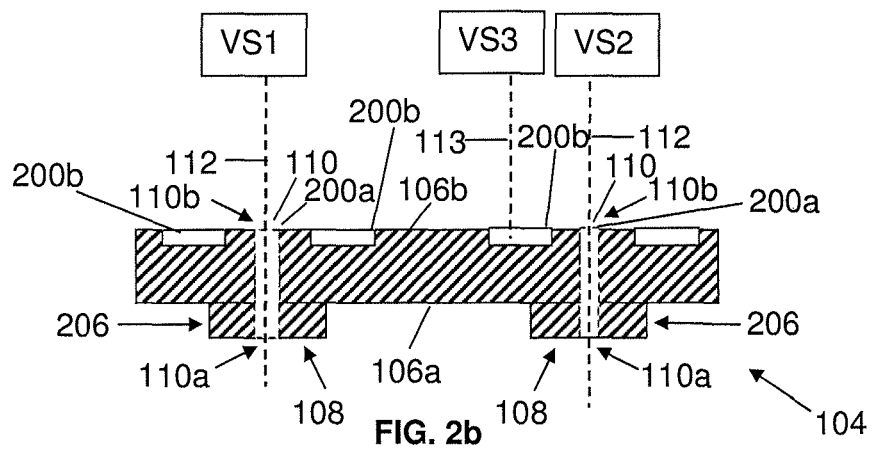

FIG. 2b is a cross-sectional view of the collet 104 as viewed along line A-A' in the direction shown in FIG. 2a. It can be seen that the internal conduits 110 extend from the respective openings 110a of the support surfaces 108 at the first side 106a of the body 106 to the respective openings 110b at the second side 106b of the body 106. It can also be seen that the support surfaces 108 of the collet 104 correspond to surfaces of respective contact pads 206 arranged on the first side 106a of the collet's body 106.

Figure 3:
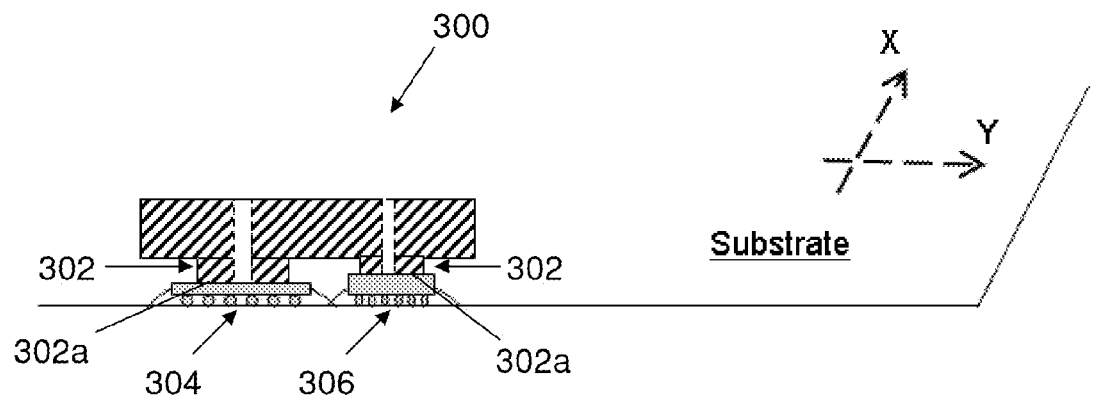
FIG. 3 a different collet according to a second preferred embodiment of the invention.

FIG. 3 shows a different collet 300 according to a second embodiment of the invention. The collet 300 of the second embodiment of the invention is similar to the collet 104 of the first embodiment, except in relation to the feature of the contact pads. In particular, the collet 300 of the second embodiment comprises contact pads 302 of different sizes, such that the support surfaces 302a of the contact pads 302 are arranged at different heights (or levels) for accommodating and holding different semiconductor devices (shown as flip chips 304, 306) of different size and thickness. It should be appreciated that the support surfaces 302a of the contact pads 302 may also comprise different surface areas for holding different semiconductor devices.

Various methods of bonding semiconductor devices (e.g. flip chips) to a substrate (eg. a lead frame) via thermocompression bonding will now be described. In particular, each of these methods involves the step of transferring the semiconductor devices to the substrate using the collet 104 according to the first embodiment of the invention. However, it should be appreciated that the collet 300 of the second embodiment of the invention may also be used if the circumstances permit.

Figure 4:
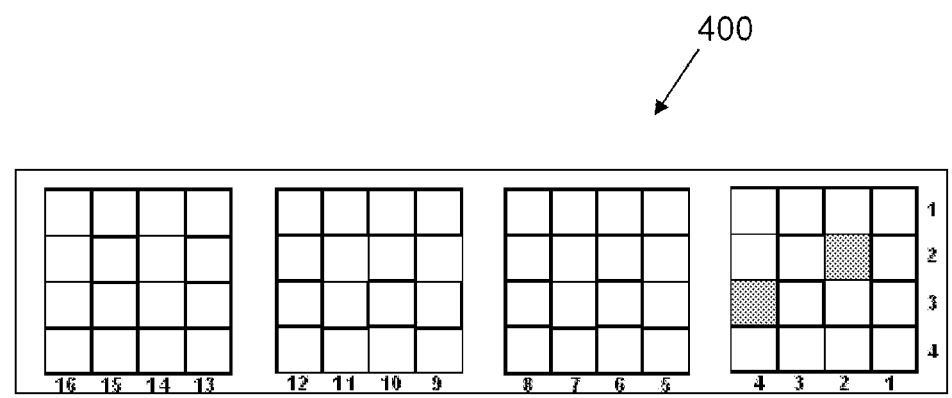
FIG. 4 shows a typical layout of a conventional substrate.

FIG. 4 shows a typical layout of a conventional substrate 400 comprising four blocks of bond pads, each block having bond pads arranged across four rows in four columns. Accordingly, the substrate 400 comprises of a total of 64 bond pads arranged across four rows in 16 columns. As shown in FIG. 4, the substrate 400 includes two bad bond pads (indicated by shaded boxes) that are not suitable for bonding with semiconductor devices. Accordingly, a semiconductor device bonder (eg. a flip chip bonder) should preferably record the respective locations of these bad bond pads in its processor to avoid bonding semiconductor devices to any of the bad bond pads, and thereby avoiding wastage. As for the good bond pads, adhesives such as non-conductive paste (NCP) or flux are pre-applied on each of the good bond pads on the substrate 400 prior to bonding.

Figure 5:
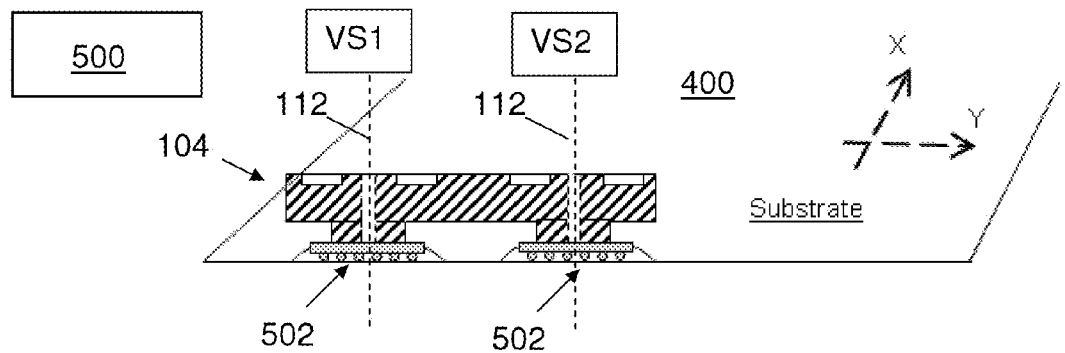
FIG. 5 shows the step of bonding flip chips simultaneously to the substrate of FIG. 4 via a first preferred method of thermocompression bonding.

FIG. 5 shows the step of bonding two flip chips 502 simultaneously to the substrate 400 via thermocompression bonding by a flip chip bonder using the collet 104, according to a first method of the thermocompression bonding process. Specifically, this method also involves the step of transferring the two flips chips 502 simultaneously from a supply 500 of flip chips to the substrate 400. This is done by activating the vacuum sources VS1, VS2 along the vacuum paths 112 to hold the flip chips 502 against the collet 104. It should be noted that the relative position of the flip chips 502 when held by the collet 104 should match the relative position of the corresponding bond pad locations on the substrate 400. Preferably, the accuracy between the relative position of the flip chips 502 and the relative position of the corresponding bond pad locations should be within an accuracy threshold of two microns. By simultaneously transferring the flip chips 502 from the supply 500 of flip chips to the substrate 400 and simultaneously bonding the transferred flip chips to the substrate 400 via thermocompression bonding, the UPH of the flip chip bonder is estimated to be about 1000. In other words, the throughput capacity of the flip chip bonder can be increased by about 100% through the use of the collet 104, compared with conventional thermocompression bonding methods.

Figure 6:
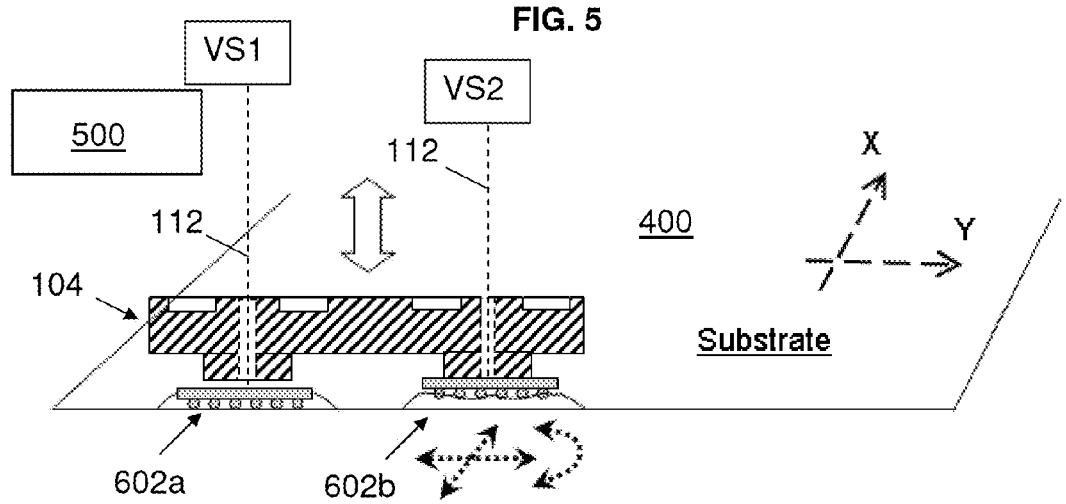
FIG. 6 shows the step of individually placing flip chips on the substrate of FIG. 4 via a second preferred method of thermocompression bonding.

FIG. 6 shows the step of individually aligning two flip chips 602a, 602b that are held by the collet 104 using an imaging device (not shown) before they are individually placed on the substrate 400, according to a second method of the thermocompression bonding process. Specifically, this method involves the steps of transferring the two flips chips 602a, 602b simultaneously from the supply 500 of flip chips to the substrate 400 by a flip chip bonder using the collet 104; aligning a first flip chip 602a and a second flip chip 602b with respect to the corresponding bond pad locations on the substrate 400 using an imaging device and, thereafter, placing the first flip chip 602a on the substrate 400 without performing thermocompression bonding; retracting the second flip chip 602b and aligning it with respect to the corresponding bond pad location on the substrate 400 using the relevant positional information that was previously derived by the imaging device and, thereafter, placing the second flip chip 602b on the substrate 400; and, finally, performing thermocompression bonding simultaneously in respect of the two flip chips 602a, 602b on the substrate 400. In particular, the steps of aligning the respective flip chips 602a, 602b with respect to the corresponding bond pad locations comprise repositioning the collet 104 with respect to the imaging device.

Since adhesives are pre-applied on the bond pads of the substrate 400, the position of the first flip chip 602a that is placed on the substrate 400 can be maintained even though thermocompression bonding has not begun. It should be appreciated that upon placing the first flip chip 602a on the substrate 400, the vacuum source VS1 is preferably controlled to deactivate the vacuum suction force that previously held the first flip chip 602a against the collet 104. However, the vacuum source VS2 remains activated so that the remaining second flip chip 602b that is held against the collet 104 continues to be held in position by the corresponding vacuum suction force.

Preferably, after the first flip chip 602a is placed on the substrate 400, the bond head 100 of the flip chip bonder moves upward to create sufficient space between the collet 104 and the first flip chip 602a in order to avoid disturbing the position of the first flip chip 602a (which is placed on the substrate 400) when aligning the second flip chip 602b with respect to the second bond pad location on the substrate 400. During the upward motion of the bond head 100, a positive gas pressure from the corresponding opening 110a of the support surface 108 that previously held the first flip chip 602a (which is now placed on the substrate 400) may be created, so as to better maintain the position of the first flip chip 602a on the substrate 400. This is be done by controlling the pneumatic vacuum source VS1 to create a positive gas pressure through the corresponding internal conduit 110 of the collet 104.

In this case, since the transferred flip chips 602a, 602b are individually aligned with respect to the corresponding bond pad locations of the substrate 400 before they are individually placed thereon, the accuracy threshold between the relative position of the flip chips 602a, 602b when held by the collet 104 and the relative position of the corresponding bond pad locations can be relaxed to more than two microns. Such a method may provide an estimated UPH of about 830. In other words, the throughput capacity of the flip chip bonder can be increased by about 66% through the use of the collet 104, compared with conventional thermocompression bonding methods.

A third method of the thermocompression bonding process also involves the use of the collet 104. Specifically, this method involves the initial steps of transferring flips chips individually from the supply 500 of flip chips to the substrate 400 by a flip chip bonder using a transfer device; aligning each transferred flip chip individually with respect to the corresponding bond pad location on the substrate 400 using an imaging device and, thereafter, placing the flip chip thereon without performing thermocompression bonding. The transfer device may be a conventional collet that is configured to hold a single semiconductor device.

In particular, the flip chips are individually placed on alternate rows of the bond pads on the substrate 400, ie. row 1, row 3, row 5, row 7, etc. However, it should not be understood that the flip chips should be individually placed on odd-numbered rows of the bond pads on the substrate 400. Instead, it should be understood that the flip chips should be arranged on the rows of the bond pads corresponding to the addition of 1 with the multiples of the number of flip chips that the collet 104 is configured to hold. This means that if a different configuration of the collet 104 is configured to hold three flip chips, the flip chips may be individually placed on the rows of the bond pads corresponding to the addition of 1 with the multiples of three, ie. row 1, row 4, row 7, row 10, etc.

After the flip chips have been individually placed on the substrate 400, the bond head 100 of the flip chip bonder will then reposition itself to replace the transfer device with the collet 104 of the first embodiment of the invention. Subsequently, the flip chips from the supply 500 of flip chips are then transferred to the substrate 400 using the replaced collet 104. In particular, the flip chips are individually placed on alternate rows of the bond pads corresponding to row 2, row 4, row 6, etc.

Figure 7:
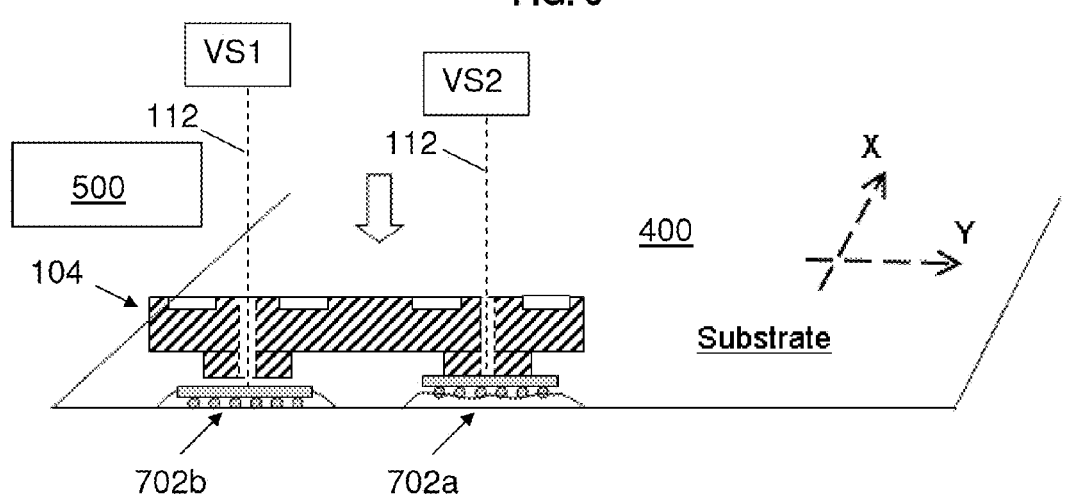
FIG. 7 shows the step of individually placing flip chips on the substrate of FIG. 4 via a third preferred method of thermocompression bonding.

Likewise, the step of aligning a flip chip that is held by the collet 104 against the substrate 400 is performed to ensure placement accuracy. Referring to FIG. 7, as a flip chip 702a is placed on the corresponding bond pad location on the substrate 400 along row 2, one of the support surface 108 of the body 106 of the collet 104 that does not hold any corresponding flip chip contacts with an existing flip chip 702b on the corresponding bond pad along row 1. This therefore allows both the transferred flip chip 702a and the existing flip chip 702b to be simultaneously bonded to the substrate 400 via thermocompression bonding. Such a method may provide an estimated UPH of about 630. In other words, the throughput capacity of the flip chip bonder can be increased by about 26% through the use of the collet 104, compared with conventional thermocompression bonding methods.

In this case, although the flip chips are individually transferred by the collet 104 to the substrate 400, it should however be appreciated that two or more flip chips may be simultaneously transferred by a different configuration of the collet 104 that is capable of holding the same number of flip chips.

In reality, substrates will usually comprise bad bond pads as shown in FIG. 4. By individually placing the flip chips on the substrate 400, the flip chip bonder can advantageously ensure that no semiconductor device is bonded to any one of the bad bond pads to thereby avoid wastage.

Various other embodiments within the scope of the invention as claimed can also be envisaged. For example, although the preferred embodiments of the collet 104 have been described as comprising two support surfaces 108 for holding two semiconductor devices simultaneously during thermocompression boding, it should be appreciated that other embodiments of the collet 104 may comprise three or more such support surfaces 108 for holding the same number of semiconductor devices. It should also be appreciated that the substrate 400 may be a reconstructed substrate on a stiffener.

The invention claimed is:

1. A device for holding a plurality of semiconductor devices during thermocompression bonding, the device comprising:
    a body;
    a plurality of support surfaces at a first side of the body, each support surface being configured to hold at least one semiconductor device during thermocompression bonding; and
    a plurality of internal conduits within the body, each internal conduit extending from an opening of a respective one of the support surfaces at the first side of the body to an opening at a second side of the body,
    wherein each of the openings at the second side of the body is configured to be connected to a respective first pneumatic path to be in fluid communication therewith, each first pneumatic path having an independently controlled pneumatic suction force so that the openings of the support surfaces at the first side of the body are operative to selectively hold the one or more semiconductor devices against the support surfaces at the first side of the body or to release the same therefrom; and
    a closed collet passage arranged along a surface of the second side of the body which is operative to be in fluid communication with a further pneumatic path for forming an enclosed vacuum path on the body for holding the device against a heater.

2. The device of claim 1, wherein the second side of the body further comprises a plurality of first pneumatic passages which are operative to be in fluid communication with respective ones of the first pneumatic paths.

3. The device of claim 2, wherein each of the openings at the second side of the body is arranged at an end of a respective one of the first pneumatic passages.

4. The device of claim 2, wherein each of the first pneumatic passages includes a kink.

5. The device of claim 1, wherein the second side of the body comprises the collet passage which is operative to be in fluid communication with the further pneumatic path having an independently controlled pneumatic suction force.

6. The device of claim 5, wherein the collet passage is arranged along a periphery of the second side of the body.

7. The device of claim 1, wherein the support surfaces at the first side of the body are arranged at different heights for holding different semiconductor devices.

8. The device of claim 1, wherein the support surfaces at the first side of the body comprise different surface areas for holding different semiconductor devices.

9. An apparatus for holding semiconductor devices during thermocompression bonding, the apparatus comprising:
    a heater;
    wherein the device of claim 1 is coupled to the heater;
    wherein the heater is operative to heat the device of claim 1 to thereby heat the semiconductor devices that are being held.

10. The apparatus of claim 9, wherein the heater comprises a plurality of through holes which are operative to be in fluid communication with respective ones of the internal conduits within the body of the device for holding a plurality of the semiconductor devices.

11. The apparatus of claim 10, wherein the second side of the body of the device for holding a plurality of the semiconductor devices further comprises a plurality of first pneumatic passages which are operative to be in fluid communication with respective ones of the first pneumatic paths, and each of the through holes of the heater and the corresponding opening at the second side of the body of the device for holding a plurality of the semiconductor devices are arranged at opposite ends of a respective one of the first pneumatic passages on the second side of the body of the device for holding a plurality of the semiconductor devices.

12. The apparatus of claim 11, wherein the heater further comprise another through hole which is operative to be in fluid communication with the further pneumatic path having an independently controlled pneumatic suction force to hold the body of the device for holding a plurality of the semiconductor devices, such that the device for holding a plurality of the semiconductor devices is operative to be detachably coupled to the heater.

* * * * *